United States Patent [19]

den Boer et al.

[11] Patent Number: 5,539,219
[45] Date of Patent: Jul. 23, 1996

[54] THIN FILM TRANSISTOR WITH REDUCED CHANNEL LENGTH FOR LIQUID CRYSTAL DISPLAYS

[75] Inventors: Willem den Boer; Tieer Gu, both of Troy, Mich.

[73] Assignee: OIS Optical Imaging Systems, Inc., Northville, Mich.

[21] Appl. No.: 444,673

[22] Filed: May 19, 1995

[51] Int. Cl.⁶ .......................... H01L 29/786; H01L 29/41
[52] U.S. Cl. ................. 257/72; 257/59; 257/66; 437/41
[58] Field of Search ................. 257/59, 66, 72; 437/40, 41, 21

[56] References Cited

U.S. PATENT DOCUMENTS

| | | |
|---|---|---|
| 4,618,873 | 10/1986 | Sasano et al. . |
| 4,723,838 | 2/1988 | Aoki et al. . |
| 4,862,234 | 8/1989 | Koden . |
| 4,949,141 | 8/1990 | Busta . |
| 5,047,819 | 9/1991 | Tanaka et al. . |
| 5,051,800 | 9/1991 | Shoji et al. . |
| 5,055,899 | 10/1991 | Wakai et al. . |
| 5,071,779 | 12/1991 | Tanaka et al. . |
| 5,075,674 | 12/1991 | Katayama et al. . |
| 5,153,754 | 10/1992 | Whetten . |
| 5,156,986 | 10/1992 | Wei et al. . |
| 5,162,931 | 11/1992 | Holmberg . |
| 5,270,567 | 12/1993 | Mori et al. ................. 257/66 |
| 5,294,811 | 3/1994 | Aoyama et al. . |
| 5,355,002 | 10/1994 | Wu . |
| 5,367,392 | 11/1994 | Janai . |
| 5,414,283 | 5/1995 | den Boer ................. 257/59 |

FOREIGN PATENT DOCUMENTS

| | | | |
|---|---|---|---|
| 63-77159 | 4/1988 | Japan | ................. 437/40 |
| 2-83941 | 3/1990 | Japan | ................. 437/40 |

Primary Examiner—Jerome Jackson, Jr.
Attorney, Agent, or Firm—Myers, Liniak & Berenato

[57] ABSTRACT

A liquid crystal display including an array of thin film transistors. Each thin film device in the array includes gate, source and drain electrodes. At least one of the source and drain electrodes include first and second metal layers offset with respect to one another so as to reduce the channel length of the transistors. Because of the reduced TFT channel length, the TFT channel width can also be reduced while maintaining the same ON current. Thus, the gate-source capacitance is reduced which in turn reduces pixel flickering and image retention and improves gray level uniformity. The first and second source-drain metal layers are of different materials so that the etchant for the second metal does not etch the first metal layer deposited. The TFT may be either a linear TFT or a ring-shaped TFT according to different embodiments of this invention.

13 Claims, 4 Drawing Sheets

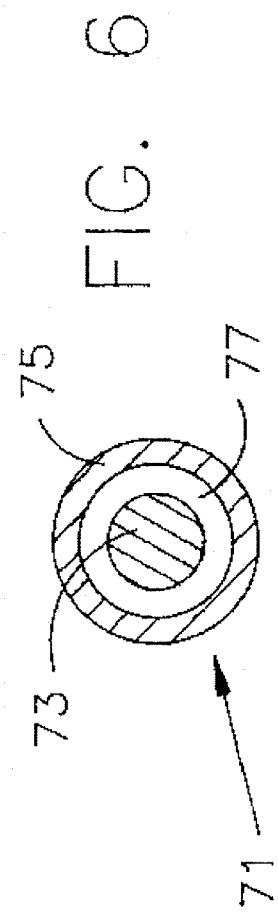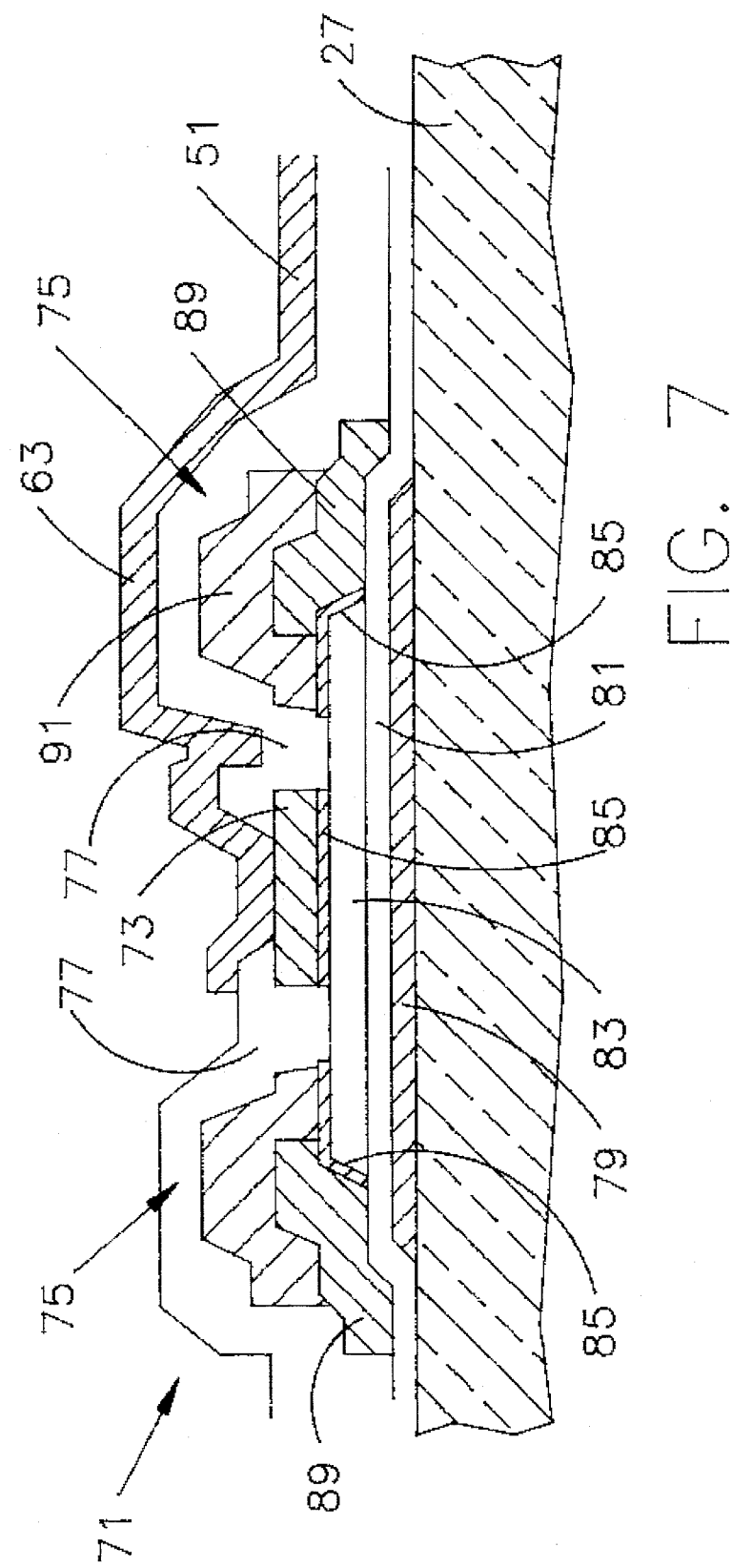

THIN FILM TRANSISTOR WITH REDUCED CHANNEL LENGTH FOR LIQUID CRYSTAL DISPLAYS

This invention relates to an array of thin film transistors, each transistor having a reduced channel length. More particularly, this invention relates to an array of thin film transistors (TFTs) adapted to be used in an LCD, each TFT having a reduced channel length so as to limit gate-source capacitance which in turn reduces pixel flickering and image retention thereby improving the viewing characteristics of the LCD.

BACKGROUND OF THE INVENTION

Active matrix liquid crystal display (AMLCD) devices are typically composed of a matrix of liquid crystal pixels arranged horizontally in rows and vertically in columns. Such devices include first and second opposing polarizers, a liquid crystal layer disposed between the polarizers, and transparent electrodes mounted on opposite sides of the liquid crystal (LC) layer so as to selectively energize same in order to create an image for a viewer.

Electronic matrix arrays find considerable application in AMLCDs. Such active matrix displays generally include X and Y (or row and column) address lines which are vertically and horizontally spaced apart and cross at an angle to one another thereby forming a plurality of crossover points. Associated with each crossover point is an element to be selectively addressed. These elements in many instances are liquid crystal display pixels or alternatively the memory cells of an electronically addressable memory array.

Some form of isolation device (e.g. a thin film transistor) is generally associated with each array element or pixel. The isolation devices permit the individual pixels to be selectively addressed by the application of suitable potentials between respective pairs of the X and Y address lines.

Amorphous silicon (a-Si) TFTs have found wide usage for isolation devices in such LCD arrays. Thin film transistors (TFTs) formed from deposited semiconductors such as amorphous silicon alloys are ideally suited for such applications because they exhibit a high dark resistivity and, therefore, have low OFF state currents. The reverse leakage currents are low so that high on-to-off current ratios are made possible for effectively isolating non-addressed array pixels from the pixels being addressed.

Structurally, thin film transistors (TFTs) generally include substantially co-planar source and drain electrodes, a semiconductor material between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted.

The source and drain electrodes in conventional TFT arrays are typically deposited and patterned on a substrate by way of either flat panel steppers or large area scanning projection aligners in order to define a channel length and width between the source and drain. Large area scanning projection aligners using a single large area mask cost about half as much as flat panel steppers, and have about twice the manufacturing throughput as the steppers. Conventional scanning projection aligners typically have a resolution of from about 4 to 6 μm while conventional flat panel steppers typically have a resolution of from about 3 to 4 μm. In consideration of cost and manufacturing throughput, it is clear that it would be desirable to utilize scanning projection aligners as opposed to flat panel steppers so as to decrease manufacturing costs and increase throughput.

TFT channel lengths smaller than those achievable with certain scanning projection aligners are often desirable for reasons to be discussed below. Typically, TFT source-drain channel lengths of about 6 μm can be obtained with scanning projection aligners. However, it is often desirable to achieve channel lengths less than 6 μm.

The resulting channel lenth of a TFT is typically larger or longer than the minimum feature size of the aligner used due to overetching of the source and drain. In the case of Mo source-drain metal, for example, the overetch is typically about 1 μm so that a designed channel length of 4 μm ends up as a post-processing TFT channel length of about 6 μm. As a result of this, the channel width must be increased in order to maintain the same ON current because the TFT ON current is proportional to W/L where "W" is the channel width and "L" is the channel length. Accordingly, there exists a need in the art for a thin film transistor (and method of manufacturing same) having a channel length smaller than that allowed by the minimum feature size or resolution of the equipment used to manufacture the TFT so that, for example, about a 4 μm channel length or less can be achieved using low-cost equipment such as scanning projection aligners (instead of flat panel steppers).

Smaller TFT channel lengths are often desirable for the following reasons. Pixel voltage shift $\Delta V_p$ in thin film transistor LCDs after switching off the gate electrode is proportional to the gate-source capacitance ($C_{gs}$) of the thin film transistor. $\Delta V_p$ can cause flicker, image retention, and gray level non-uniformity in liquid crystal display operation. An effective way to reduce $C_{gs}$ (i.e. parasitic or gate-source capacitance) is by shortening the channel length of the TFT. When the channel length is reduced, the channel width "W" can be reduced proportionally so as to decrease $C_{gs}$ because $C_{gs}$ is proportional to the channel width.

FIG. 1 is a side elevational cross-sectional view of prior art linear thin film transistor (TFT) 1. A plurality of TFTs 1 are typically arranged on transparent insulating substrate 3 in the form of a matrix array in AMLCD applications. Each TFT 1 includes gate electrode 5 connected to a gate line (not shown) extending in the row direction, drain electrode 7 connected to a drain line (not shown) extending the column direction, and source electrode 9 connected to transparent pixel electrode 11 independently formed in an area surrounded by the gate and drain lines. Pixel electrode 11 operates in conjunction with an opposing electrode on the other side of the liquid crystal layer (not shown) so as to selectively drive the pixel enabling the respective polarizers to transmit or absorb light rays in order to create an image for the viewer. A TFT electrode, to which a data signal is supplied, will be referred to hereinafter as a drain electrode.

More specifically, gate electrode 5 is formed on clear substrate 3. Gate insulating film 13, made of silicon oxide or silicon nitride, for example, is formed on the upper surface of substrate 3 and on the upper surface of gate electrode 5. Semiconductor film 15, consisting of amorphous silicon (a-Si) for example, is stacked on gate insulating film 13 above gate 5. Drain and source electrodes 7 and 9 respectively are formed on semiconductor film 15. The linear shaped source and drain electrodes are separated from one another by a predetermined distance forming channel length 17. Drain and source electrodes 7 and 9 respectively utilize contact layers 7a and 9a, and drain-source metal layers 7b and 9b, and are electrically connected to semiconductor film 15.

Unfortunately, when TFT 1 is manufactured using, for example, a conventional scanning projection aligner to position the source and drain electrodes on substrate 3, the resulting channel length 17 of TFT 1 cannot be made as small as desired thereby resulting in an undesirably high parasitic capacitance ($C_{gs}$). High parasitic capacitance values for TFTs are undesirable as set forth above because they tend to cause pixel flickering, image retention, and gray scale non-uniformity. As the parasitic capacitance of a TFT is decreased, the pixel voltage shift when the gate is switched off becomes smaller. As the pixel voltage shift decreases, it becomes easier to compensate the top plate voltage to eliminate DC components for all gray levels and across the entire display area.

Flickering results from a small DC component across the pixel electrodes spanning the liquid crystal layer. Pure AC voltage across the electrodes is ideal. By reducing the parasitic capacitance, the DC component across the pixel electrodes can be substantially eliminated or reduced thereby greatly reducing pixel flickering, electrochemical degradation, and image retention of the LC material.

In view of the above, it is apparent that there exists a need in the art for a liquid crystal display including a TFT array wherein the TFTs in the array have reduced parasitic capacitances and are cost effective to manufacture. Such TFTs are achievable in accordance with this invention by reducing the obtainable TFT channel lengths so as to decrease parasitic capacitance values in order to reduce flickering, image retention, and gray scale non-uniformity of the display. It would also be desirable if TFT channel lengths smaller than those allowed by the feature size of the manufacturing equipment could be obtained so as to reduce costs.

It is a purpose of this invention to fulfill the above-described needs, as well as other needs in the art which will become more apparent to the skilled artisan once given the following disclosure.

SUMMARY OF THE INVENTION

Generally speaking, this invention fulfills the above-described needs in the art by providing a liquid crystal display having an array of thin film transistors, the liquid crystal display comprising:

a plurality of pixel electrodes;

a liquid crystal layer;

an array of thin film transistors, a plurality of the thin film transistors in the array including:
  a) a gate electrode electrically connected to a gate line;
  b) a drain electrode electrically connected to a drain line; the drain electrode having first and second metal layers offset from one another;
  c) a source electrode electrically connected to one of the pixel electrodes, the source electrode having first and second metal layers offset from one another; and
  d) whereby the channel lengths of the thin film transistors are reduced as a result of the first and second metal layers being offset from one another.

This invention further fulfills the above-described needs in the art by providing a thin film transistor comprising:

a gate electrode;

a source electrode;

a drain electrode; and wherein one of the source and drain electrodes includes first and second conductive layers offset laterally with respect to one another so that the thin film transistor has a reduced channel length.

This invention still further fulfills the above-described needs in the art by providing a method of making a thin film transistor comprising the steps of:

a) depositing a gate electrode on a substrate;

b) depositing a semiconductor layer over the gate electrode;

c) depositing a first source-drain metal layer over the semiconductor layer;

d) patterning the first source-drain metal layer to form source and drain electrode layers having a channel length $L_1$ defined therebetween;

e) depositing a second metal layer over the first patterned source-drain metal layer; and f) patterning the second metal layer to form at least one of a source electrode and a drain electrode, the second metal patterned so that it is offset with respect to the first patterned source-drain metal layer and the channel length of the transistor is less than length $L_1$.

In certain preferred embodiments of this invention, the resulting channel length $L_2$ of the TFT is equal to $L_2 = L_1 - \Delta L$ where $\Delta L$ is the offset length between the first and second deposited source-drain metal layers on at least one of the source in drain electrodes.

This invention will now be described with respect to certain embodiments thereof, along with reference to the accompanying illustrations wherein:

IN THE DRAWINGS

FIG. 6 is a top view illustrating the source and drain electrodes of a TFT cross-sectionally according to a ring-shaped TFT embodiment of this invention.

FIG. 7 is a side cross-sectional view of the FIG. 6 ring-shaped TFT with reduced annular channel length.

DETAILED DESCRIPTION OF CERTAIN EMBODIMENTS OF THIS INVENTION

Figure 1:
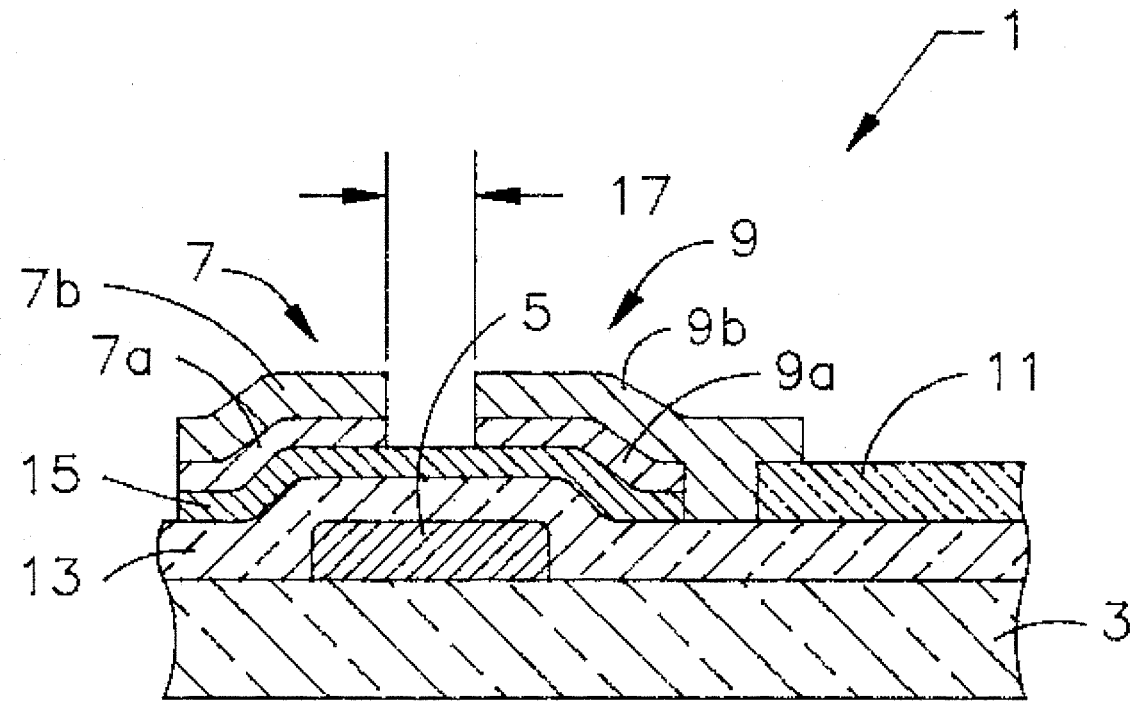
FIG. 1 is a side elevation cross-sectional view of a prior art linear-type TFT.

Referring now more particularly to the following illustrations where like reference numerals indicate like parts throughout the several views.

Figure 3:
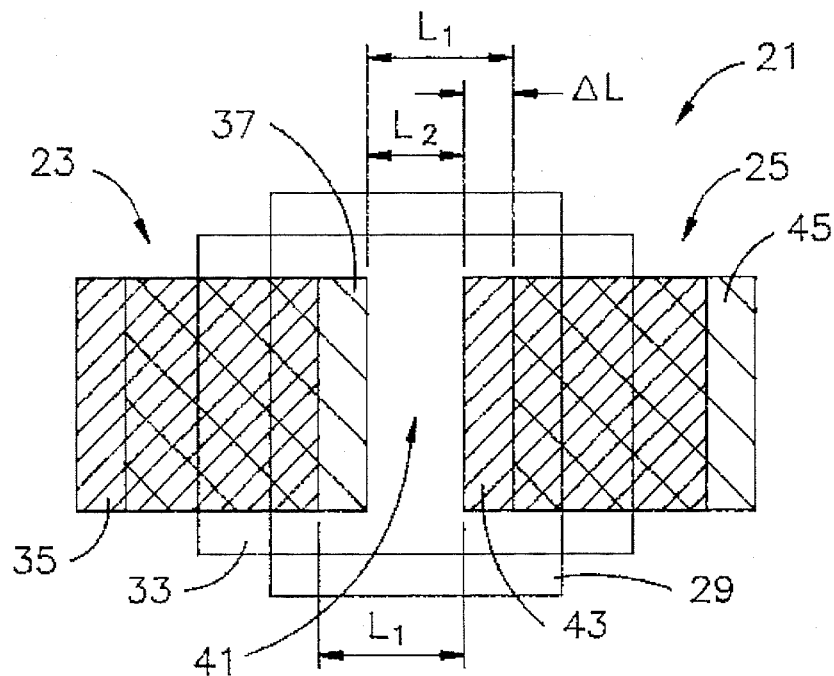
FIG. 3 is a top view illustrating the linear TFT of FIG. 2.
Figure 2:
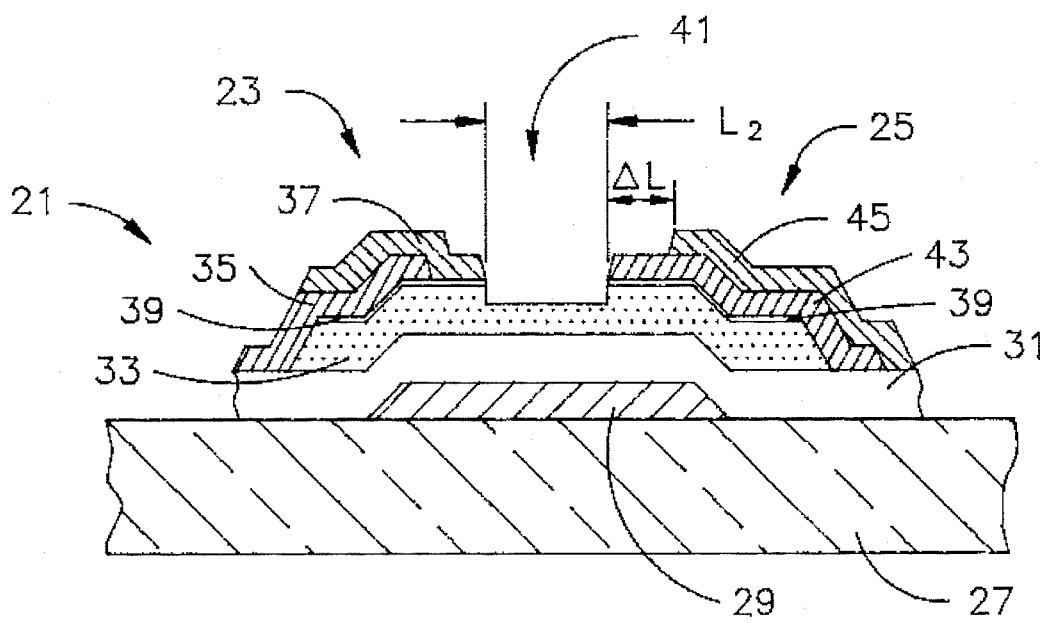
FIG. 2 is a side elevational cross-sectional view of a linear TFT according to an embodiment of this invention.

FIGS. 2–3 are side cross-sectional and top views respectively of linear thin film transistor (TFT) 21 according to an embodiment of this invention. TFT 21 has a channel length $L_2$ shorter than that allowed by the feature size of the lithography (e.g. when a scanning projection aligner is used) used for patterning drain electrode 23 and source electrode 25. Source electrode 25 is connected to LCD pixel electrode 51 (see FIGS. 4–5) so as to permit TFT 21 to selectively energize a corresponding pixel in order to provide image data to a viewer, TFT 21 effectively functioning as a switch for the corresponding LCD pixel. An array of TFTs 21 is provided in a typical active matrix liquid crystal display so as to correspond with an array of pixel electrodes 51.

TFT 21 includes transparent substrate 27 (e.g. made of glass), metal gate electrode 29, gate insulating layer 31, semiconductor layer 33 (e.g. amorphous silicon), contact layer 39, drain electrode 23, and source electrode 25.

Drain electrode 23 includes first deposited metal drain layer 35 (e.g. Cr) and second deposited metal drain layer 37 (e.g. Mo), with contact film 39 (e.g. amorphous silicon doped with an impurity such as phosphorous) disposed between semiconductor layer 33 and first deposited metal drain layer 35. Drain layers 35 and 37 are offset with respect to one another by an amount ΔL so that layer 37 is disposed closest to and defines TFT channel 41 while first deposited drain layer 35 is located in a spaced relation from channel 41. Drain metals 35 and 37 are deposited in separate steps (e.g. via conventional photolithographic methods) so as to have substantially equivalent lengths according to certain embodiments of this invention. According to other embodiments, the first-deposited source-drain metal layer 35, 43 (e.g. Cr) has a channel length $L_1$ less than the channel length $L_1$ defined by the second-deposited layer 37, 45 (e.g. Mo).

Source electrode 25 includes first deposited metal layer 43 (e.g. Cr) and second deposited metal layer 45 (e.g. Mo). Source layers 43 and 45 are deposited and patterned on substrate 27 in separate steps over top of gate 29, gate insulating layer 31, and semiconductor layer 33 by way of conventional photolithographic techniques according to certain embodiments of this invention. Source layers 43 and 45 are offset with respect to one another so that first deposited metal layer 43 is closest to and defines TFT channel 41 in conjunction with second deposited drain metal layer 37. Accordingly, second deposited source metal layer 45 is spaced from TFT channel 41 by an offset amount ΔL. First deposited drain layer 35 is also spaced from channel 41 by an offset amount ΔL according to certain embodiments of this invention with these two ΔL values being either substantially the same or different according to different embodiments of this invention.

Source metal layer 43 and drain metal layer 35 are deposited and patterned in the same photolithographic step and are made of the same metal (e.g. Cr) according to certain embodiments, with second source-drain metal layers 45 and 37 (e.g. Mo) being then deposited over top of layers 43 and 35 in a second photolithographic step so that the second deposited source-drain layers are offset an amount ΔL from the first deposited layers 43 and 35.

As a result of the lateral offset provided between the first (Cr) and second (Mo) deposited source-drain metal layers, TFT 21 has a channel length $L_2$ shorter than that allowed by the feature size of the lithography used for patterning source 25 and drain 23. Because the offset ΔL (e.g. from about 1 to 3 μm) may vary across the substrate, different TFTs in the array may have different channel lengths $L_2$. The reduction of $C_{gs}$ across the array clearly overshadows this variation tendency.

After first source-drain metal layers 35 and 43 are deposited and patterned, second layers 37 and 45 are then deposited and patterned (offset to the first layers) using the same (or different in some embodiments) channel length $L_1$ over top of layers 35 and 43, the result being TFT channel length $L_2$ which is shorter than the feature size of the lithography used for depositing and patterning the source and drain electrodes. The resulting TFT channel 41 length $L_2$ is defined by the following equation:

$$L_2 = L_1 - \Delta L$$

Where $L_1$ is the length or gap defined between first-deposited layers 35 and 43 (or layers 37 and 45). ΔL is the amount the second deposited source-drain layers are offset laterally with respect to the first deposited source-drain metal layers. In other words, channel length $L_2$ is defined by the originally patterned channel length size $L_1$ minus the offset amount ΔL.

With reference to FIGS. 2–3, it will now be explained how TFT 21 is manufactured. Gate electrode 29 consisting essentially of a metal film (e.g. Ta) having a thickness of about 1,000–5,000 Å, most preferably about 2,500 Å, is deposited by means of sputtering or vapor deposition on the cleaned top surface of transparent insulating substrate 27. Insulating substrate 27 may be made of glass, quartz, sapphire, or the like. The metal film is then patterned by photolithography or the like to form gate electrode 29. After anodization, the Ta layer 29 (when originally 2,500 Å thick) is about 1,800 Å thick and the created TaO layer is about 1,600 Å thick. Thus, layer 31 in FIG. 2 is made up of both the TaO layer and the silicon nitride layer. Other metals from which gate electrode 29 may be made include Cr, Al, titanium, tungsten, copper, and combinations thereof.

Gate insulating film 31 (e.g. SiN or $Si_3N_4$) is then formed on the surface of substrate 27 by plasma enhanced chemical vapor deposition (CVD) or the like so as to have a thickness of about 2,000–3,000 Å (preferably either about 2,000 Å or 3,000 Å) and cover gate electrode 29. Silicon nitride, silicon oxide, tantalum oxide, or combinations thereof may be used to form gate insulating film or layer 31.

Subsequently, semiconductor layer 33, made of amorphous silicon (a-Si) or the like and contact films 39 also made of amorphous silicon (a-Si) doped with an impurity at high concentration (e.g. about 1% phosphorous) are continuously formed or stacked by plasma chemical vapor deposition or the like on gate insulating film 31 so that layer 33 is disposed between film 31 and contact films 39. Semiconductor layer 33 is deposited to a thickness of, for example, about 2,000 Å while contact layers 39 are deposited to a thickness of, for example, about 500 Å. Semiconductor layer 31 may be from about 1,000 Å to 4,000 Å thick while doped layers 39 may be from about 200 Å to 1,000 Å thick according to certain embodiments of this invention.

Semiconductor layer 33 and contact films 39 are patterned by photolithography or the like so as to cover a portion above gate electrode 29. Instead of the above-mentioned amorphous silicon, amorphous silicon carbide, tellurium, selenium, germanium, cadmium sulfide, cadmium selenide, or the like may be used a material for semiconductor layer 33 and contact films 39.

The first source-drain metal layer (which results in layers 35 and 43) having a thickness of from about 500–5,000 Å (preferably from about 500 to 2,000 Å, and most preferably about 1,000 Å thick) is then formed on the entire surface extant by vapor deposition, sputtering, or the like so as to cover contact films 39. This metal (e.g. Cr) film is then patterned by photolithography, etching, or the like in order to remove the metal layer and contact films 39 at channel portion 41 thereby forming drain metal layer 35 and source metal layer 43 above gate electrode 29. First deposited drain and source layers 35 and 43 respectively are separated by a channel length $L_1$ after patterning. Layers 35 and 43 are made of chromium (Cr) according to certain embodiments of this invention. Other metals which may be used include titanium, aluminum, tungsten, tantalum, copper, molybdenum (Mo), or the like.

Subsequent to the depositing and patterning of source-drain layers 35 and 43, layers 37 and 45 are deposited and patterned from a single metal layer using the same feature size channel length but offset by an amount $\Delta L$ from the first-deposited layers 35 and 43. A single metal (e.g. Mo) layer from about 1,000 Å to 7,000 Å thick (preferably about 5,000 Å of Mo) is deposited and patterned to form drain metal 37 and source metal 45 which are separated by an amount $L_1$. According to certain embodiments of this invention, second-deposited source-drain metal layers 37 and 45 are made of Mo so that the etchant for layers 37 and 45 (Mo) does not etch first-deposited layers 35 and 43 (Cr). The a-Si layers 39 are etched using the combination of the first and second deposited source-drain metals (or photoresist) as the delineation. The resulting TFT channel length is $L_2=L_1-\Delta L$. In order to maintain the same ON-current, TFT 21 can be designed so as to have a reduced channel width $W_2=(L_1-\Delta L)\times W/L_1$ where W is the original channel width of a conventional linear TFT with the same ON current.

According to certain embodiments of this invention, the etchant for Cr (first deposited source-drain metal layer) is a commonly used mixture of ceric ammonium nitrate and nitric acid in deionized water, and the etchant for Mo (second deposited source-drain metal) consists of a mixture of phosphoric acid, acetic acid, nitric acid, and deionized water. Such etchants are used for the two offset source-drain layers so that the etchant for the Mo does not etch the Cr. Thus, the same mask can be used for both metal layer patterning steps. When the same mask is used for the first and second source-drain patterns, possible overlay error which could have occurred if different masks were used is reduced. On typical exposure equipment, the offset of the two source-drain metals can be automatically programmed.

After depositing and patterning drain electrode 23 and source electrode 25, a passivation layer (e.g. SiN or $Si_3N_4$) is deposited over top of the source and drain. The passivation layer (not shown in FIGS. 2–3, but discussed and shown with respect to FIG. 7) is then removed only in the pixel electrode 51 areas. The passivation layer may be from about 2,000 to 4,000 Å thick, most preferably about 2,000 Å thick according to certain embodiments of this invention.

The pixel electrode layer (e.g. ITO) 51 may be deposited on substrate 27 at any one of a number of possible positions during the manufacturing of TFT 21. Firstly, the ITO pixel electrode layer (not shown in FIGS. 2–3 but discussed and shown with respect to FIGS. 4, 5, and 7) may be deposited over top of the passivation layer and thereafter patterned to form pixel electrode members 51, and connectors 63 which are affixed to source electrode 25. A via or aperture may be defined in the passivation layer which allows the ITO pixel electrode layer (or connector 63) to make electrical contact with source 25.

Secondly, the ITO pixel electrode layer may be deposited after the depositing of silicon nitride layer 31 on substrate 27 but before the deposition of the source-drain metals. Again, the ITO pixel electrode layer is in electrical contact with source 25.

Thirdly, the ITO pixel electrode layer may be deposited underneath of silicon nitride layer 31 directly on substrate 27 with a via being defined in layer 31 so as to allow the ITO layer to make electrical contact with source 25. In this embodiment, the ITO layer is patterned so it does not make electrical contact with gate electrode 29.

The reduction of the TFT channel length to a value $L_2$ from a value $L_1$ combined with the reduction of the channel width reduces the parasitic capacitance ($C_{gs}$) so as to reduce pixel flickering, image retention, and gray level non-uniformity in LCD operations. The reduction in channel width is the major contributor to the reduction in $C_{gs(ON)}$. Exemplary $\Delta L$ values according to certain embodiments of this invention are from about 2 to 3 µm while exemplary channel length values $L_2$ are from about 2 to 4 µm when conventional photolithographic features sizes (on scanning projection aligners or flat panel steppers, for example) of about 6 µm are used.

Figure 4:
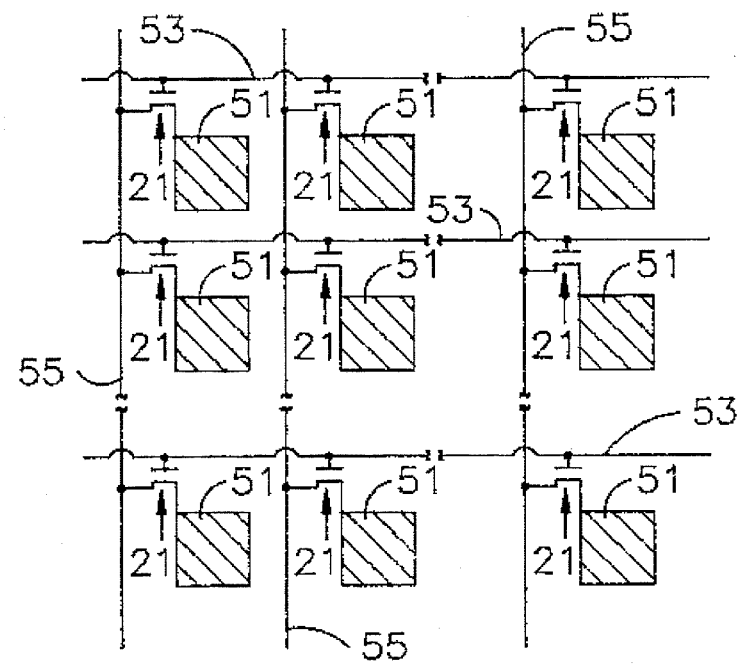
FIG. 4 is a diagram of a TFT array including a plurality of the FIG. 2 TFTs connected to respective gate and drain address lines.

FIG. 4 illustrates an array of thin film transistors (TFTs 21) which act as switching elements for LCD pixel electrodes 51. Each TFT 21 is electrically connected to a row address line 53 and a column address line 55. For example, row address lines 53 (i.e. gate lines) are connected to TFT gate electrodes 29 while column address lines 55 (i.e. drain lines) are connected to TFT drain electrodes 23. Another advantage associated with certain embodiments of this invention is that the use of first and second-deposited source-drain metals allows for full redundancy for column lines 55 so that the incidence of partial open column lines is reduced thereby improving manufacturing yield.

Figure 5:
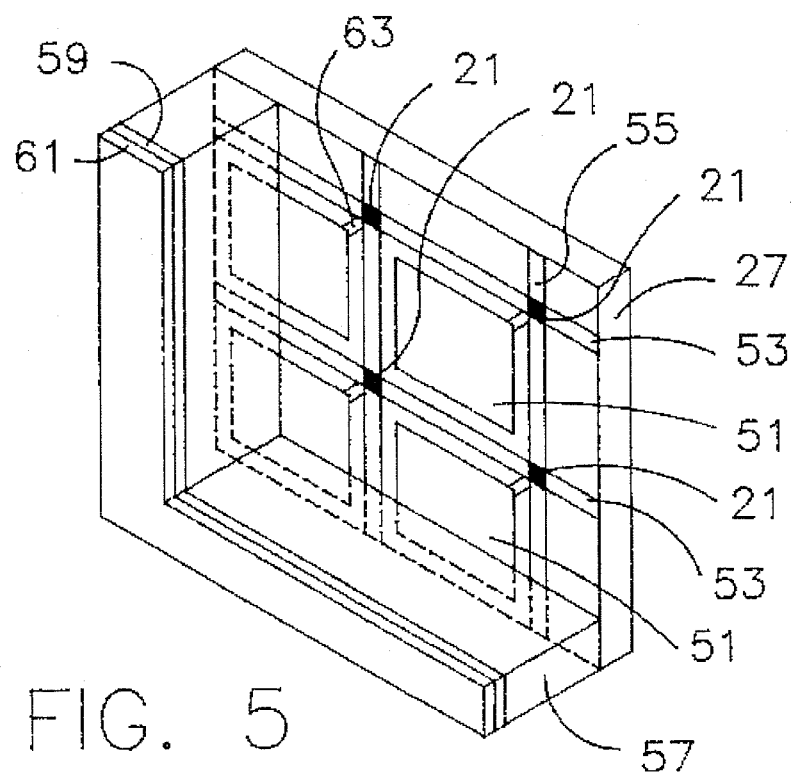
FIG. 5 is a partial cut-away perspective view of an active matrix liquid crystal display including a plurality of the FIG. 2 TFTs arranged in an array so as to act as switching devices for the pixels.

FIG. 5 is a perspective partially cut-away view of an active matrix liquid crystal display including an array of TFTs 21 which act as switching elements for pixel electrodes 51. The AMLCD is made up of liquid crystal layer 57 sandwiched between substrate 27 and substrate 61. Common electrode 59 is positioned adjacent liquid crystal layer 57 and is located between LC layer 57 and substrate 61. TFTs 21 are connected to pixel electrodes 51 (e.g. made of transparent ITO) by way of conductive ITO connecting portions 63.

FIGS. 6 and 7 are top and side cross-sectional views respectively of a ring-shaped TFT 71 according to another embodiment of this invention. Ring-shaped TFT 71 includes round or annular source electrode 73 which is substantially completely surrounded by annular drain electrode 75 so as to form annular TFT channel 77.

Gate electrode 79 is first formed on transparent substrate 27. Following the depositing and patterning of metal (e.g. Ta) gate electrode 79, gate insulating layer (e.g. silicon nitride) 81 is deposited on substrate 27 over top of gate electrode 79. Then, semiconductor layer 83 (e.g. amorphous silicon) and contact layers 85 (e.g. doped amorphous silicon) are formed on gate insulating layer 81 and substrate 27.

Following the deposition of semiconductor layer 83, a first source-drain metal layer (which results in layers 73 and 89) is deposited on substrate 27 over top of layers 81 and 83. After deposition, the first source-drain metal layer (e.g. Cr) is patterned via conventional photolithography so as to form source electrode 73 and annular first deposited drain metal layer 89. Annular drain layer 89 circumferentially surrounds or encompasses source layer 73 so as to reduce the parasitic capacitance of the TFT.

After the formation of source-drain layers 73 and 89, the channel length $L_1$ of the TFT is defined by the lateral distance between the outer diameter of source electrode 73 and the inner diameter of drain electrode 89. Following the formation of source-drain layers 73 and 89, a second metal (e.g. Mo) layer is deposited over top of the first metal layer and patterned so as to form second-deposited drain layer 91 which is formed over top of and offset relative to first-deposited drain layer 89. As illustrated, because second-deposited drain layer 91 is offset with respect to first-deposited layer 89, the resulting channel length $L_2$ of the TFT is reduced by the amount of offset $\Delta L$ as in the previous embodiment. Thus, the resulting TFT channel length $L_2$ is again equal to $L_1 - \Delta L$ where $\Delta L$ is the amount of lateral offset between layers 89 and 91 and $L_1$ is the channel length defined between first-deposited layers 73 and 89. For a more detailed description of a ring-shaped TFT, see U.S. Pat. No. 5,414,283 and U.S. Ser. No. 08/375,658, the disclosures of which are hereby incorporated herein by reference.

This invention will now be described with respect to an example as follows:

EXAMPLE 1

An array of linear-type TFTs 21 (see FIGS. 2–3) was manufactured and tested as follows. The TFTs each included substrate 27, tantalum (Ta) gate 29, silicon nitride insulating film 31, amorphous silicon (a-Si) semiconductor layer 33, amorphous silicon doped contact films 39, chromium (Cr) first-deposited source-drain metal layers 35 and 43, and molybdenum (Mo) second-deposited source-drain metal layers 37 and 45 as set forth in FIGS. 2–3. The second deposited source-drain metal layers were laterally offset an amount $\Delta L$ from the first-deposited source-drain metal layers as shown in FIGS. 2–3. The offset amount for each TFT 21 was about 2.5 to 3.0 μm. The TFTs in the array each had a channel 41 length $L_2$ of about 3 μm and a channel 41 width of about 24 μm. The thickness of silicon nitride layer 31 was about 2,000 Å and the thickness of Ta gate 29 was about 2,500 Å. The thickness of Cr source-drain layers 35 and 43 was about 1,000 Å and the thickness of Mo source-drain metal layers 37 and 45 was about 5,000 Å. Measurements obtained from this TFT 21 array are set forth below in Tables 1 and 2 where the TFTs of this example (TFT Array #2) are compared to two different (TFT Array #s 1 and 3) prior art linear-type TFT arrays. This concludes this Example.

TABLE 1

| Substrate | Channel Width | Channel Length | SiN Thickness | TaO Thickness | Comment |
|---|---|---|---|---|---|
| TFT Array #1 (prior art) | 24 μm | 6 μm | 2,000 Å | 0 Å | No offset No anodization |
| TFT Array #2 Example 1 | 24 μm | 3 μm | 2,000 Å | 0 Å | Short-channel TFT No anodization |
| TFT Array #3 (prior art) | 24 μm | 6 μm | 2,000 Å | 1,600 Å | Standard process |

TABLE #2

| Substrate # | TFT Loc | $I_{OFF}$ [pA] | $I_{ON}$ [μA] | $V_{th}$ [V] | μ cm²/V–s | $C_{gs(OFF)}$ [fF] | $C_{gs(ON)}$ [fF] | $C_{gd(OFF)}$ [fF] | $C_{gd(ON)}$ [fF] |
|---|---|---|---|---|---|---|---|---|---|
| TFT Array #1 (prior art) | BR | 0.08 | 12.7 | 1.06 | 1.16 | 28 | 60 | 30 | 64 |
| | TR | 0.16 | 12.0 | 1.60 | 1.01 | — | — | — | — |
| | TL | | | | | | | | |
| | (1) | 0.03 | 12.4 | 1.47 | 0.97 | 25 | 57 | 28 | 59 |
| | (2) | −1.51 | 12.8 | 1.51 | 0.97 | — | — | — | — |
| | BL | 1.09 | 12.1 | 1.70 | 1.00 | — | — | — | — |
| TFT Array #2 | BR | 0.21 | 20.0 | 1.38 | 0.94 | 23 | 46 | 40 | 76 |
| | TR | | | | | | | | |
| | (+) | 0.03 | 18.4 | 1.30 | 0.77 | 22 | 46 | 46 | 76 |
| | (−) | 1.14 | 15.8 | 1.29 | 0.70 | | | | |
| | TL | 0.12 | 17.2 | 0.79 | 0.79 | 24 | 46 | 38 | 65 |
| | BL | | | | | | | | |
| | (+) | 2.23 | 26.1 | 1.20 | 1.20 | 28 | 49 | 40 | 67 |
| | (−) | 0.99 | 20.0 | 0.30 | 0.86 | | | | |
| TFT Array #3 (prior art) | BR | 0.37 | 8.99 | 2.18 | 0.88 | 24 | 50 | 34 | 65 |
| | TL | 0.03 | 7.46 | 1.94 | 0.68 | 26 | 52 | 28 | 54 |

(1) & (2): two different TFTs
(+) & (−): same TFT but source/drain switched

As set forth above in TABLE 1, TFTs according to the FIG. 2–3 embodiment of this invention (TFT Array #2) were compared to TFTs from prior art arrays (TFT Array #1 and TFT Array #3). Each array included a plurality of TFTs all having channel widths of about 24 μm. The TFTs of Arrays #s 1 and 3 had channel lengths of about 6 μm while the TFTs of Array #2 (see Example 1) had channel lengths of about 3 μm. The thickness of silicon nitride layer 31 in all three arrays was about 2,000 Å. In TFT Array #3, anodization took place so as to form a tantalum oxide (TaO) layer about 1,600 Å thick where the gate electrode was, of course, formed of tantalum. In TFT Array #s 1 and 2, however, no anodization step was performed. Therefore, the thickness of the TaO layer in Array #s 1 and 2 was 0 Å. Only one source-drain metal (Mo) was used in the prior art arrays.

In the "TFT location" column of TABLE 2, the term "BR" refers to a TFT on the "bottom right" of substrate 27. Accordingly, the term "TR" refers to a TFT on the "top right" of substrate 27, the term "TL" refers to a TFT on the "top left" portion of substrate 27, and the term "BL" refers to a TFT on the "bottom left" portion of substrate 27.

As evident from TABLE 2 above, the short-channel TFTs (Array #2) according to the different embodiments of this invention realize certain advantages over the prior art (TFT Array #s 1 and 3) TFTs. The often-described figure of merit for a thin film transistor (TFT) is $I_{ON}/C_{gs(ON)}$. In other words, the TFT figure of merit is the ON current divided by gate-source capacitance in the ON state. It is desirable to increase this figure of merit to as high a level as possible. The ON current ($I_{ON}$) is the ever important parameter used in determining how fast a pixel will charge up. $C_{gs(ON)}$ is the gate-source capacitance in the TFT ON state and determines the pixel voltage drop or shift after switching off the gate.

For example, $I_{ON}/C_{gs(ON)}$ for the top left TFT of Array #2 was measured to be about 0.374. In comparison to this, $I_{ON}/C_{gs(ON)}$ for the top left (1) TFT in prior art Array #1 was measured to be only about 0.217. Furthermore, the figure of merit $I_{ON}/C_{gs(ON)}$ for the top left measured TFT in Array #3 was measured to be only about 0.143. Thus, it is clear that the TFTs from Array #2 (see FIGS. 2–3) have substantially higher values for $I_{ON}/C_{gs(ON)}$ than do corresponding TFTs in prior art Array #1 and prior art Array #3. The improvement in this value for the different embodiments of this invention results in reduced pixel flickering, reduced image retention, and improved gray scale uniformity.

It is noted that all of the TFTs in the charts above have the same channel width. It is important to point out that because the channel length in TFT Array #2 is reduced, the channel width can also be reduced while maintaining the same ON current. This will, of course, further substantially reduce $C_{gs}$ so as to result in even better viewing characteristics of the LCD.

The advantages of the TFTs according to the FIGS. 2–3 embodiment of this invention is also illustrated by the measured $C_{gs(ON)}$ values set forth in TABLE 2. The measured values indicate that the TFTs in Array #2 have reduced parasitic capacitance values with respect to corresponding TFTs in prior art Array #1 and prior art Array #3. For example, the bottom right TFT in Array #2 had a $C_{gs(ON)}$ of 46 fF while the bottom right TFT in prior art Array #1 had a $C_{gs(ON)}$ value of 60 fF. The bottom right TFT in prior art Array #3 (anodized) had a $C_{gs(ON)}$ value of 50 fF. Thus, it is clear that corresponding TFTs in Array #2 had reduced parasitic capacitances with respect to the TFTs of prior art Array #1 and prior art Array #3 even though the channel width of the TFTs 21 in Array #2 were not reduced as they could have.

Once given the above disclosure many other features, modifications, and improvements will become apparent to the skilled artisan. Such other features, modifications, and improvements are therefore considered to be a part of this invention, the scope of which is to be determined by the following claims:

We claim:

1. A liquid crystal-display having an array of thin film transistors, the liquid crystal display comprising:

a plurality of pixel electrodes;

a liquid crystal layer;

an array of thin film transistors, a plurality of the thin film transistors in said array including:
  a) a gate electrode electrically connected to a gate line;
  b) a drain electrode electrically connected to a drain line, said drain electrode having first and second metal layers offset from one another;
  c) a source electrode electrically connected to one of said pixel electrodes, said source electrode having first and second metal layers offset from one another; and
  d) whereby the channel lengths of said thin film transistors are reduced as a result of the first and second metal layers being offset from one another.

2. The liquid crystal display of claim 1, wherein said first drain metal layer and said first source metal layer define a length or gap $L_1$ therebetween;

said second drain metal layer and said second source metal layer define substantially the same length or gap $L_1$ therebetween;

the offset of said first and second metal layers of at least one of said source and drain is $\Delta L$; and wherein the channel length $L_2$ of said plurality of thin film transistors is equal to $L_2 = L_1 - \Delta L$ thereby reducing the gate-source capacitance of said thin film transistors.

3. The liquid crystal display of claim 1, wherein said first and second drain metal layers also make up said drain lines whereby the redundancy of the drain lines is increased in order to reduce the incidence of partially open or non-conductive drain lines.

4. The liquid crystal display of claim 1, wherein said first drain and source metal layers are of a first metal and said second drain and source metal layers are of a second metal different than said first metal.

5. The liquid crystal display according to claim 4, further including an a-Si semiconductor layer disposed between said gate electrode and said source and drain electrodes.

6. The liquid crystal display of claim 5, wherein the etchant for said second metal does not etch the first metal.

7. A thin film transistor comprising:

a gate source electrode;

a source electrode;

a drain electrode; and wherein one of said source and drain electrodes includes first and second conductive layers offset laterally with respect to one another so that the thin film transistor has a reduced channel length; and wherein the thin film transistor channel length $L_2$ is defined by the equation:

$$L_2 = L_1 - \Delta L$$

where $L_1$ is the length defined between said first conductive layer and the similar layer of the other of said source and drain electrodes, and $\Delta L$ is the lateral offset between said first and second conductive layers.

8. The thin film transistor of claim 7, wherein said first and second conductive layers are of different metals adapted to be etched by different materials.

9. The thin film transistor of claim 8, wherein both of said source and drain electrodes have different first and second metal layers offset from one another to define a reduced transistor channel length.

10. The thin film transistor of claim 7, further comprising a plurality of gate lines connected to said gate electrodes and a plurality of drain lines connected to said drain electrodes, and wherein said transistors are ring-shaped so that said drain electrode substantially and completely surrounds said source electrode.

11. The thin film transistor of claim 7, further including drain address lines connected to said drain electrodes and gate address lines connected to said gate electrodes, and wherein said drain electrodes and drain lines each include first and second metal layers.

12. The thin film transistor of claim 7, wherein said source electrode of each transistor is connected to a corresponding pixel electrode in a liquid crystal display, and the channel width $W_2$ of the transistor is defined by the equation $W_2=(L_1-\Delta L)\cdot W/L_1$ where W is the typical channel width of a TFT having channel length $L_1$ and the same ON current.

13. A thin film transistor system comprising:

an array of thin film transistors disposed on a substrate, wherein at least one of said thin film transistors includes:

a gate electrode connected to a gate line;

a source electrode connected to a pixel electrode;

a drain electrode connected to a drain line;

a semiconductor layer disposed between (i) said gate electrode and (ii) said source and drain electrodes;

a doped semiconductor contact layer disposed between said semiconductor layer and at least one of said source and drain electrodes; and wherein one of said source and drain electrodes includes first and second conductive layers laterally offset with respect to one another so that the thin film transistor has a reduced channel length thereby reducing gate-source capacitance.

* * * * *